(12) United States Patent
Coullomb et al.

(10) Patent No.: US 11,038,595 B2
(45) Date of Patent: Jun. 15, 2021

(54) OPTICAL TRANSMISSION/RECEPTION CIRCUIT

(71) Applicant: STMICROELECTRONICS (GRENOBLE 2) SAS, Grenoble (FR)

(72) Inventors: Alexandre Coullomb, Apprieu (FR); Romain Coffy, Voiron (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/409,723

(22) Filed: May 10, 2019

(65) Prior Publication Data

US 2019/0356390 A1 Nov. 21, 2019

(30) Foreign Application Priority Data

May 18, 2018 (FR) ........................................ 1854154

(51) Int. Cl.
| | |
|---|---|
| *H04B 10/40* | (2013.01) |
| *H01L 31/0203* | (2014.01) |
| *H01L 25/04* | (2014.01) |
| *H04B 10/50* | (2013.01) |
| *H04B 10/69* | (2013.01) |

(52) U.S. Cl.
CPC .......... *H04B 10/40* (2013.01); *H01L 25/042* (2013.01); *H01L 31/0203* (2013.01); *H04B 10/501* (2013.01); *H04B 10/691* (2013.01)

(58) Field of Classification Search
CPC ... H01L 31/16; H01L 31/0203; H01L 25/042; H04B 10/40; H04B 10/501; H04B 10/691; G01S 7/4813
See application file for complete search history.

(56) References Cited

U.S. PATENT DOCUMENTS

| | | | |
|---|---|---|---|
| 2009/0053856 A1 | 2/2009 | Ohsumi | |
| 2012/0104454 A1* | 5/2012 | Coffy | ................... H01L 31/0203 257/100 |
| 2013/0341650 A1 | 12/2013 | Peng | |
| 2014/0231635 A1 | 8/2014 | Kerness et al. | |
| 2015/0303321 A1 | 10/2015 | Fukunaka et al. | |
| 2016/0306042 A1 | 10/2016 | Schrank et al. | |
| 2017/0294426 A1 | 10/2017 | Uchida | |
| 2018/0108802 A1 | 4/2018 | Chen | |

FOREIGN PATENT DOCUMENTS

JP 58-128762 A 8/1983

* cited by examiner

*Primary Examiner* — Timor Karimy
(74) *Attorney, Agent, or Firm* — Seed Intellectual Property Law Group LLP (57) ABSTRACT

An optoelectronic device includes a substrate and a first optoelectronic chip flush with a surface of the substrate. The device includes a cover that covers the substrate and the first optoelectronic chip. The cover comprises a cavity above a first optical transduction region of the first optoelectronic chip. The device also includes a second optoelectronic chip having a second optical transduction region spaced apart from the first optical transduction region and the cavity continues above the second optical transduction region.

20 Claims, 5 Drawing Sheets

OPTICAL TRANSMISSION/RECEPTION CIRCUIT

BACKGROUND

Technical Field

The present disclosure generally concerns electronic circuits and, more specifically, an optical transduction circuit.

Description of the Related Art

Certain electronic circuits comprise an electronic chip housed in a package. Such a package often comprises a substrate having the chip affixed thereon, and a cover covering the chip and the substrate.

When such a device is an optical signal transduction circuit, for example, a time-of-flight measurement proximity sensor, the electronic chip comprises one or a plurality of optical signal transduction regions. The package then comprises transparent elements adapted to the wavelengths of the optical signals, for example, infrared radiations. The transparent elements are placed opposite the transmission/reception regions, and are for example made of glass.

BRIEF SUMMARY

An embodiment overcomes all or part of the disadvantages of known optical transduction devices.

An embodiment provides a device comprising a substrate and an optoelectronic chip flush with a surface of the substrate.

According to an embodiment, the device comprises a cover covering the substrate and the chip.

According to an embodiment, the cover has a planar surface mechanically coupled to the substrate, preferably glued to the substrate or in direct bonding contact with the substrate.

According to an embodiment, the cover comprises an electric connection in contact with the chip.

According to an embodiment, the cover comprises a cavity above a first optical transduction region of the chip.

According to an embodiment, the cavity is filled with a transparent material.

According to an embodiment, the cavity continues above a second optical transduction region, preferably an additional chip flush with said surface of the substrate.

According to an embodiment, the cover comprises an element, crossing the cover above the first region.

According to an embodiment, the cover comprises an element, preferably transparent, crossing the cover above a first optical transduction region.

According to an embodiment, the through element continues above a second optical transduction region.

According to an embodiment, the through element continues above the second region.

According to an embodiment, a shield partially covers the through element above the second region.

An embodiment provides a method of manufacturing a device such as defined hereabove.

According to an embodiment, the method comprises a step of overmolding, preferably film-assisted, of a cover on the substrate.

According to an embodiment, the method comprises a step of arranging an electric connection in contact with the chip before the overmolding step.

According to an embodiment, the method comprises a step of arranging a transparent element on the chip before the overmolding step.

The foregoing and other features and advantages will be discussed in detail in the following non-limiting description of specific embodiments in connection with the accompanying drawings.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, the chip is not detailed, the described embodiments and variations being compatible with most current chips.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the concerned element in the concerned drawings, it being understood that, in practice, the described devices may be oriented differently. Unless otherwise specified, the terms "approximately", "substantially", and "in the order of" are used herein to designate a tolerance of plus or minus 10%, preferably of plus or minus 5%, of the value in question, or, relating to an orientation, of plus or minus 10 degrees, preferably of plus or minus 5 degrees.

Figure 1:
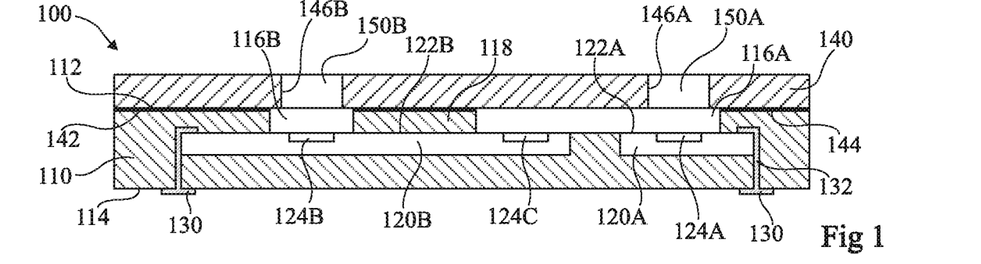
FIG. 1 is a simplified cross-section view illustrating an embodiment of an optical transduction device.

FIG. 1 is a simplified cross-section view illustrating an embodiment of an optical transduction device 100 for transmitting and/or receiving optical signals. More particularly, FIG. 1 illustrates an example of a time of-flight measurement proximity sensor.

Device 100 comprises a substrate 110. Substrate 110 is for example an assembly of glass fibers, of resin, and of conductive layers. Substrate 110 preferably has the shape of a plate, for example having two opposite surfaces 112 (upper surface) and 114 (lower surface). As an example, lower surface 114 is planar.

The device comprises a chip 120A. Chip 120A preferably comprises a portion of a semiconductor wafer, for example, made of silicon. Chip 120A is buried in the substrate, that is, it is buried in the substrate and at least partially covered with a portion of the substrate. Chip 120A is entirely comprised between the levels of surfaces 112 and 114 of substrate 110. As an example, chip 120A has a surface 122A, preferably planar, facing the side of surface 112 of substrate 110. Electronic circuits, not shown, are located in chip 120A on the side of surface 122A. Preferably, chip 120A is an optoelectronic chip. As an example, chip 120A comprises, on the side of surface 122A, an optical transduction region 124A, preferably an optical transmission region. Chip 120A may comprise a plurality of optical transduction regions.

As an example, device 100 further comprises an additional chip 120B buried in substrate 110. Preferably, chip 120B comprises a semiconductor wafer portion, for example, made of silicon. Chips 120A and 120B for example have the same thickness. Preferably, chips 120A and 120B have their respective upper surfaces 122A and 122B located in a same plane, parallel to surface 112 of substrate 110. Preferably, chip 120B is an optoelectronic chip, comprising both electronic circuits and one or a plurality of optical transduction regions on the side of surface 122B. In the illustrated example, chip 120B comprises two optical reception regions 124B and 124C. Region 124C is preferably located between optical region 124B of chip 120B and optical region 124A of chip 120A.

As an example, substrate 110 comprises an opening 116A above region 124A. Opening 116A extends from the level of surface 112 to that of surface 122A. Opening 116A is for example empty or may be filled with a gas such as air. Preferably, opening 116A is filled with a transparent material. "Transparent" here means a material giving way to all or part of optical signals transmitted or received by an optical transduction region of an optoelectronic chip. The transparent material may be an optical resin. The material of substrate 110 is preferably opaque for these optical signals.

In the illustrated example, the substrate further comprises an opening 116B located above region 124B. Preferably, openings 116A and 116B are separated by an opaque wall 118. Opening 116B may be filled with a transparent material. Preferably, opening 116A extends above region 124C. Regions 124A and 124C are then located under the same opening 116A.

As a variation, chips 124A and 124B are replaced with a single chip comprising the three regions 124A, 124B, and 124C. In another variation, the device comprises more than two chips.

As an example, device 100 further comprises metallizations 130 located on lower surface 114 of substrate 110. Metallizations 130 enable to electrically couple device 100 to an external circuit, not shown, for example, a PCB ("Printed Circuit Board"). Electric connections 132 couple metallizations 130 to chip 120A and to optional chip 120B. The electric connections are located inside of substrate 110. Preferably, the electric connections are in contact with chip 120A on the side of its surface 122A, and with optional chip 120B on the side of its surface 122B. Electric connections 132 couple metallizations 130 to the circuits of chip 120A and or optional chip 120B.

Preferably, a cover 140 covers substrate 110 on the side of its surface 112. Cover 140 is preferably made of a polymer material, for example, of a thermosetting polymer such as epoxy resin. The material of cover 140 is preferably opaque. Cover 140 preferably has the shape of a plate. Cover 140 has a planar surface 142 mechanically coupled to upper surface 112 of substrate 110. The mechanical coupling between cover 140 and substrate 110 may be performed by means of glue 144. As a variation, the mechanical coupling between cover 140 and substrate 110 is achieved by direct adhesive contact with the substrate, for example, obtained by overmolding of cover 140 on substrate 110. Cover 140 further comprises a through opening 146A located above optical transduction region 124A. A transparent element 150A is housed in through openings 146A. Transparent element 150A is preferably made of glass. Transparent element 150A for example forms an optical lens or a filter. In the illustrated example, the cover further comprises a through opening 146B located above region 124B, and a transparent element 150B housed in opening 146B.

Due to the fact that the optoelectronic chip is buried in substrate 110, device 100 has, between lower surface 114 of substrate 110 and the upper surface of cover 140, a particular small total thickness, smaller than that of usual devices. A total thickness smaller than 500 µm may typically be obtained. This enables to solve various integration problems, for example, in the case where the device has to be integrated in a compact assembly such as a cell phone. Preferably, the thickness of substrate 110 between surfaces 112 and 114 is smaller than 300 µm, for example, in the range from 150 µm to 250 µm. Preferably, the thickness of cover 140 is smaller than 300 µm, for example, in the order of 250 µm.

In the illustrated example, when the time of-flight measurement distance sensor is operating, transmission region 124A transmits an optical signal through opening 116A and transparent element 150A. Due to the fact that regions 124A and 124C are located under the same opening 116A, reception region 124C receives part of the optical signal. Opaque wall 118 prevents part of the optical signal from reaching reception region 124B without coming out of the device. Part of the optical signal reaches reception region 124B after having been reflected and having crossed transparent element 150B and opening 116B. The time of flight corresponds to the difference between the times of reception by regions 124C and 124B.

Figure 2A:
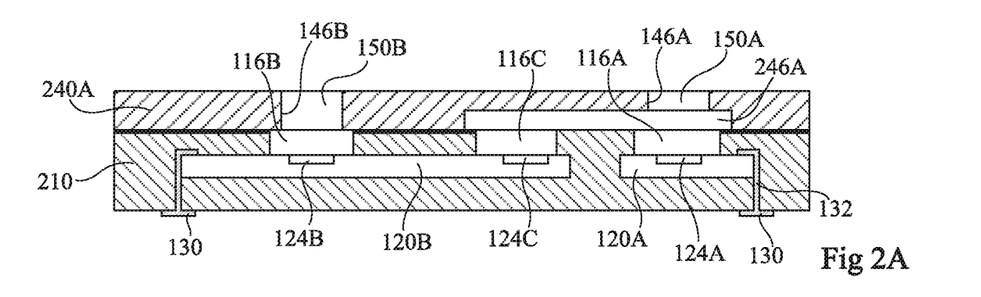
FIGS. 2A to 2C are simplified cross-section views illustrating alternative embodiments of the device of FIG. 1.
Figure 2B:
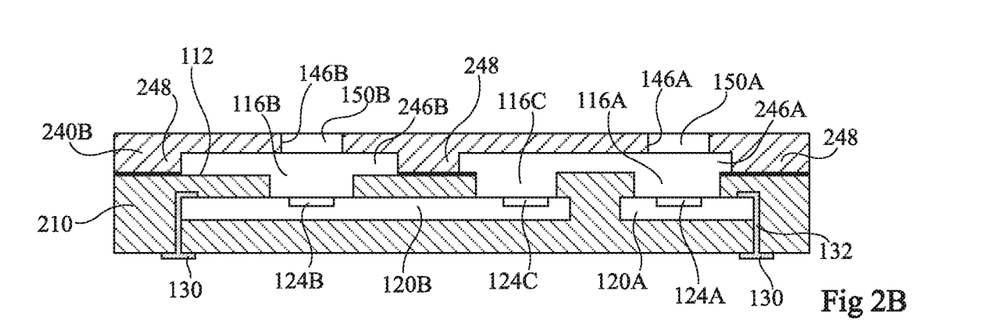
Figure 2C:
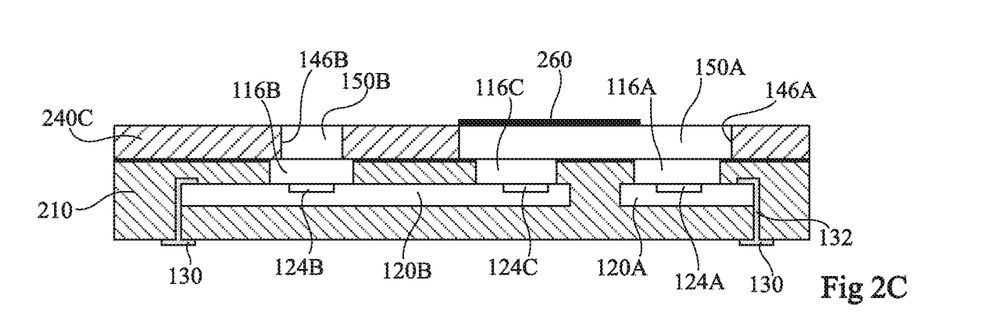

FIGS. 2A to 2C are simplified cross-section views illustrating alternative embodiments of the device of FIG. 1.

The device of FIG. 2A comprises a substrate 210, chips 120A and 120B buried in substrate 210, and a cover 240A covering substrate 210. Substrate 210 corresponds to substrate 110 of the device of FIG. 1, where opening 116A does not extend above region 124C, and the substrate comprises, above region 124C, an opening 116C separate from opening 116A. As a variation, chips 120A and 120B are replaced with a single chip comprising the three regions 124A, 124B, and 124C, or with more than two chips. Cover 240A differs from cover 140 of FIG. 1 in that it comprises a cavity 246A above region 124A. Cavity 246A is located on the side of the cover facing the chip. Preferably, cavity 246A extends above region 124C. As an example, transparent element 150A has a thickness smaller than the total thickness of the cover.

Cavity 246A is preferably filled with a transparent material. The transparent material is for example an optical resin. In operation, cavity 246A of the device of FIG. 2A transmits towards region 124C part of the optical signal emitted by region 124A.

The device of FIG. 2B comprises a substrate 210 and chips 120A and 120B, identical or similar to those of the device of FIG. 2A, arranged in identical or similar fashion. Substrate 210 is covered with a cover 240B. Cover 240B differs from cover 240A of the device of FIG. 2A in that it further comprises a cavity 246B above region 124B. Cavity 246B extends, from above opening 116B, all around opening 116B on surface 112 of substrate 210. Cavity 246B thus has lateral dimensions greater than those of opening 116B. Cavity 246B is located on the side of the cover which faces chip 124B. As an example, transparent element 150B has a thickness smaller than the total thickness of cover 240B.

Preferably, transparent elements 150A and 150B have the same thickness. Portions 248 of the cover located between and around openings 246A and 246B thus form feet which have the same height. Due to the fact that the lateral dimensions of cavities 246A and 246B are greater than those of respective openings 116A and 116B, problems of glue overflow in openings 116A and 116B are avoided.

The device of FIG. 2C comprises a substrate 210 and chips 120A and 120B, identical or similar to those of the device of FIG. 2A, arranged in identical or similar fashion. Substrate 210 is covered with a cover 240C. Cover 240C differs from that of FIG. 1 in that opening 146A and transparent through element 150A are continued above region 124C. An opaque shield 260, for example, a layer of an opaque material, covers transparent element 150A above region 124C. In operation, opaque shield 260 prevents regions 124C from receiving the reflected optical signals.

FIGS. 3A to 3G are simplified cross-section views illustrating steps of an embodiment of the device of FIG. 1, in the example of a device comprising two chips 120A and 120B.

As an example, a plurality of devices arranged in an array are simultaneously manufactured.

Figure 3A:
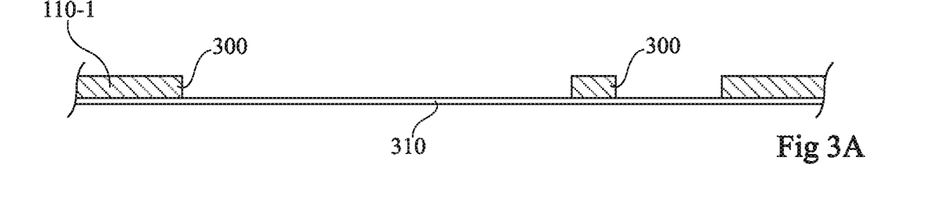
FIGS. 3A to 3G are simplified cross-section view illustrating steps of a method of manufacturing the device of FIG. 1.

At the step of FIG. 3A, a first layer 110-1 of the material of the future substrate 110, comprising openings 300 at the locations of chips 120A and 120B, is provided. Layer 110-1 preferably has the same thickness as chips 120A and 120B. Openings 300 may be through openings.

Layer 110-1 is positioned on a planar surface of an adhesive support, for example, an adhesive film 310. As an example, adhesive film 310 is a polymer film, having a thickness preferably in the range from 10 μm to 400 μm. The polymer film is covered with a layer of an adhesive allowing a temporary mechanical connection.

Figure 3B:
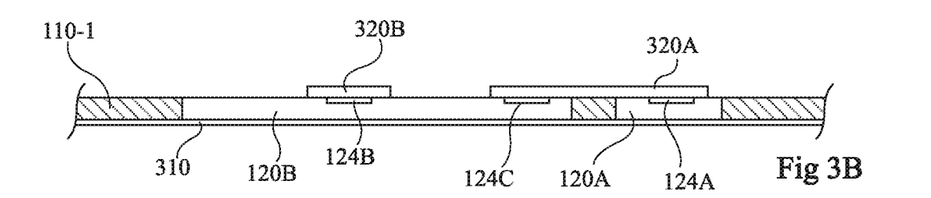

At the step of FIG. 3B, chips 120A and 120B are placed in openings 300. Chips 120A and 120B are pasted to adhesive film 310. Preferably, openings 300 have dimensions identical, to within a functional clearance, to those of chips 120A and 120B.

Chips 120A and layer 110-1 are partially covered, at the respective locations of the future openings 116A and 116B, with elements 320A and 320B, for example, portions of a layer. Preferably, elements 320A and 320B are made of a polymer material selectively etchable over the material of the future substrate 110. Protection elements 320A and 320B are for example portions of a resin film, of an opaque film, of a dry film, or of a polymer film.

Figure 3C:
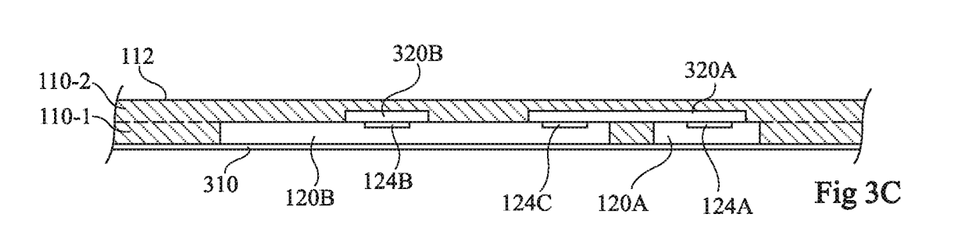

At the step of FIG. 3C, layer 110-1 and chips 120A and 120B are covered with a layer 110-2. Preferably, the material of layer 110-2 is the same as that of layer 110-1. Layer 110-2 preferably has a planar upper surface 112. The thickness of layer 110-2 corresponds to the height of the future openings 116A and 116B, that is, to the distance separating the upper surfaces of chips 120A and 120B from surface 112 of the future substrate 110.

Preferably, elements 320A and 320B have a thickness smaller than that of layer 110-2. Elements 320A and 320B protect the upper surface of chips 120A and 120B and of layer 110-1, at the locations of the openings, against a direct contact with layer 110-2.

Figure 3D:
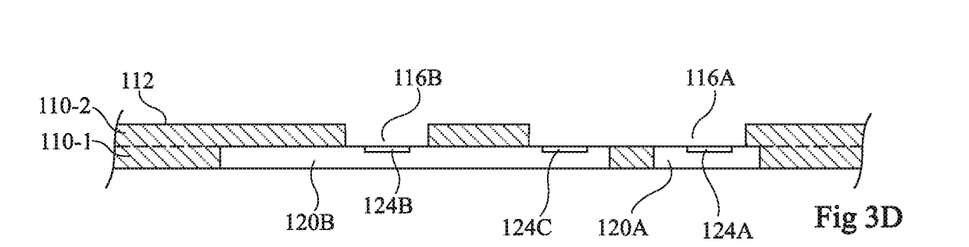

At the step of FIG. 3D, adhesive film 310 is removed. Chips 120A and 120B are in direct adhesive contact with layer 110 2. The portions of layer 110-2 located above protection elements 320A and 320B are etched at the locations of the future openings 116A and 116B. Protection elements 320A and 320B are then removed, preferably, by a selective etching. Openings 116A and 116B have thus been obtained.

As a variation, protection elements 320A and 320B have the same thickness as layer 110-2. The step of etching the portions of layer 110-2 located above protection elements 320A and 320B is then omitted.

Figure 3E:
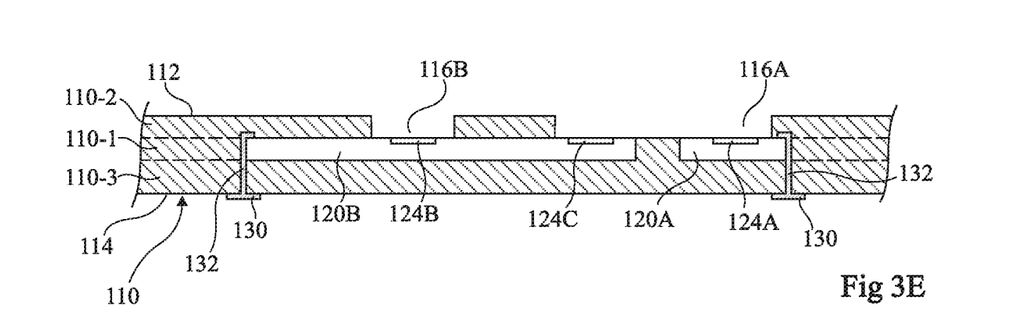

At the step of FIG. 3E, the lower surface of layer 110-1 and of chips 120A and 120B is covered with a layer 110-3, and connections 132 and metallizations 130 are formed. The material of layer 110-3 is preferably the same as that of layers 110-1 and 110-2. The lower surface of layer 110-3 forms lower surface 114 of substrate 110.

Figure 3F:
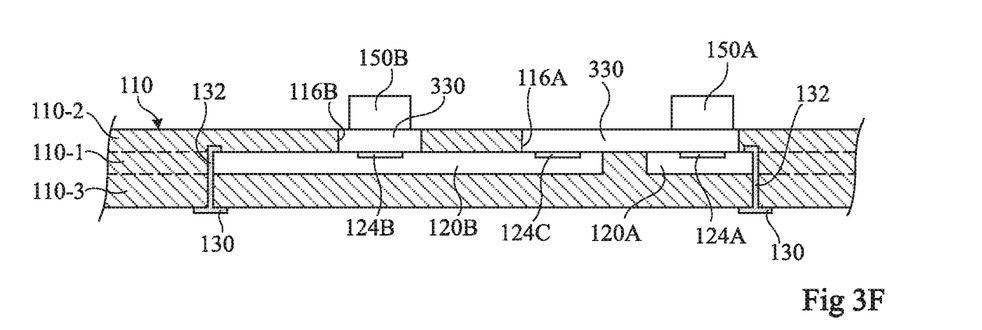

At the step of FIG. 3F, openings 116A and 116B are filled with a transparent material 330. Transparent elements 150A and 150B are then arranged at their respective locations above regions 124A and 124B.

Figure 3G:
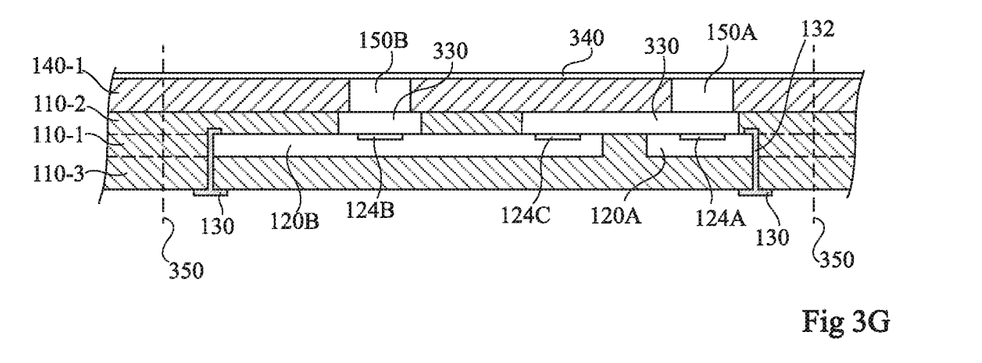

At the step of FIG. 3G, cover 140 is formed by film assisted molding. To achieve this, elements 150A and 150B are covered with a film 340. Film 340 bears against the upper surfaces of elements 150A and 150B. Film 340 is for example parallel to the plane of the layers. The entire obtained structure is then placed in a mold, not shown. A layer 140-1, for example, of constant thickness, is formed by molding. During the molding, film 340 bears against the inner surface of the mold. Layer 140-1 is for example made of a thermosetting material. The material of layer 140-1 may be the same as that of substrate 110. Elements 150A and 150B then cross layer 140-1 across its entire thickness. Film 340 is then removed. Film 340 eases the release from the mold and avoids for a portion of the material of layer 140-1 to cover elements 150A and 150B. Although the above-described molding is assisted by film 340, film 340 may be omitted and a molding which is not film-assisted may be performed.

After this, the devices are separated into individual devices, by cutting along cutting lines 350.

In each obtained device, substrate 110 is formed of layers 110-3, 110-1, and 110-2, and cover 140 is formed of layer 140-1. Cover 140, which has been overmolded on the substrate, is mechanically coupled by direct adhesive bonding to layer 110-2.

As a variation, steps 3E and 3F may be replaced with a step of manufacturing cover 140 independently from the structure obtained at the step of FIG. 3D, followed by a step of bonding cover 140 to the structure obtained at the step of FIG. 3D.

The above-described method is compatible with the alternative embodiments of FIGS. 2A to 2C and is compatible with any number of chips, for example, optoelectronic.

Figure 4A:
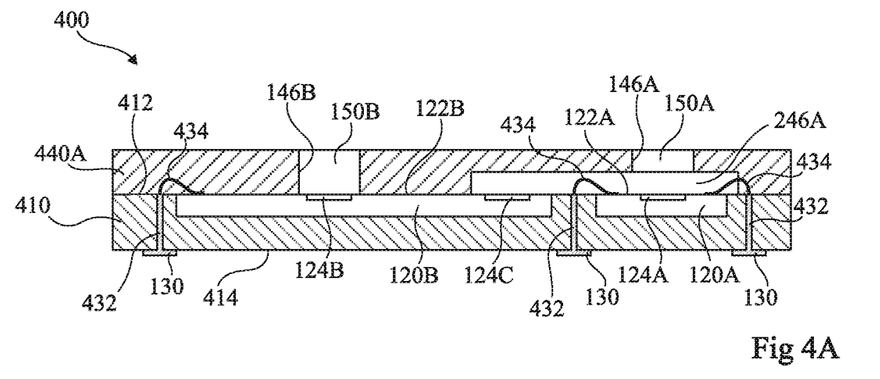
FIGS. 4A to 4C are simplified cross-section views illustrating another embodiment of an optical transduction device.
Figure 4B:
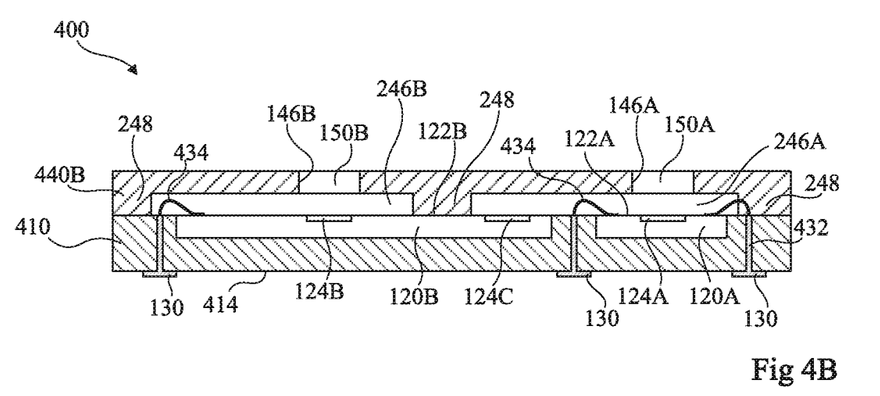
Figure 4C:
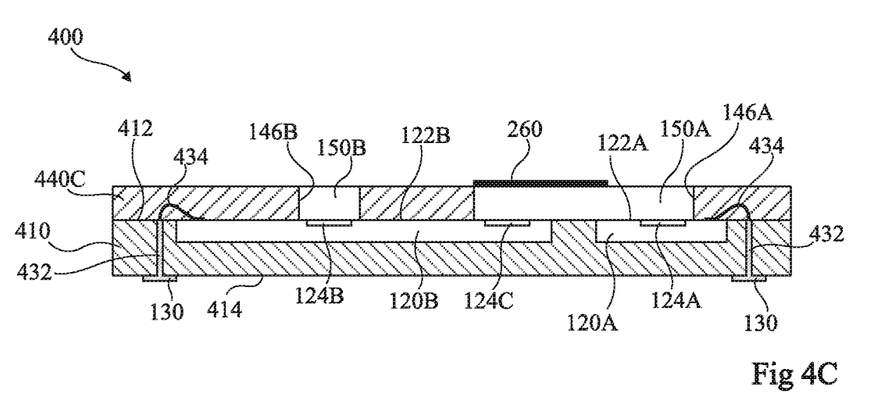

FIGS. 4A to 4C are simplified cross-section views illustrating examples of another embodiment of an optical transduction device 400. More particularly, FIGS. 4A to 4C illustrate examples of time-of-flight measurement proximity sensors.

In the examples of FIGS. 4A to 4C, device 400 comprises a substrate 410. Substrate 410 is for example an assembly of glass fibers, of resin, and of conductive layers. Substrate 410 is preferably made of an opaque material. Substrate 410 is for example in the shape of a plate, for example, having two opposite surfaces 412 (upper surface) and 414 (lower surface). As an example, surface 412 is planar.

Device 400 comprises a chip 120A and an optional chip 120B, identical or similar to those of FIG. 1. Chip 120A has a surface 122A, preferably planar, which is flush with surface 412 of substrate 410. Optional chip 120B has a surface 122B, preferably planar, which is flush with surface 412 of substrate 410. As a variation, chips 120A and 120B are replaced with a single chip comprising three optical transmission/reception regions 124A, 124B, and 124C. As a variation, device 400 comprises more than two chips.

Device 400 may further comprise, on surface 414, metallizations 130 identical or similar to metallizations 130 of the device of FIG. 1. Electric connections 432 thoroughly cross the substrate, from metallizations 130 to surface 412, preferably vertically.

In each of the examples of FIGS. 4A to 4C, substrate 410 is covered with a different example of cover. Due to the fact that chip 120A and optional chip 120B are flush with the upper surface of the substrate, the device has a total thickness from the lower surface of the substrate to the upper surface of the cover which is particularly decreased in each of these examples.

In the example of FIG. 4A, device 400 comprises a cover 440A covering substrate 410 on the side of surface 412. Cover 440A comprises elements identical or similar to those of cover 240A of FIG. 2A, arranged in identical or similar fashion. Thus, cover 440A comprises, on the side of substrate 410, a cavity 246A. Regions 124A and 124C are located under the same cavity 246A. Cover 440A further comprises through elements 150A and 150B, preferably transparent. Through elements 150A and 150B are respectively located above regions 124A and 124B. Cavity 246A is preferably filled with a transparent material.

Cover 440A further comprises electric connections 434. Connections 434 couple the tops of connections 432 to the upper surfaces of chip 120A and of optional chip 120B. Certain connections 434 may be included in the material of cover 440A. Certain connections 434 may be included in the transparent material of cavity 246A. Certain connections 434 may be partly included in the material of cover 440A and partly included in that of cavity 246A.

In the example of FIG. 4B, device 400 further comprises a cover 440B covering substrate 410 on the side of surface 412. Cover 440B comprises elements identical or similar to those of cover 140B of FIG. 2B. In particular, the cover comprises, in addition to cavity 246A, a cavity 246B. Cavities 246A and 246B may be empty or filled with air. Cover 440B may then be formed independently from substrate 410 and the elements located in the substrate, and then bonded to surface 412. To achieve this, it is provided for connections 434 to be entirely located in cavities 246A and 246B. Further, due to the fact that the portions of the cover located between and around cavities 246A and 246B form feet 248 of same height, the arranging of cover 440B on substrate 410 enables to easily obtain, between openings 246A and 246B, an opaque wall in contact with the upper surface of chip 120B flush with the upper surface of substrate 410.

In the example of FIG. 4C, device 400 further comprises a cover 440C covering substrate 410 on the side of surface 412. Cover 440C comprises elements identical or similar to those of cover 240C of FIG. 2C. An opaque shield 260 covers transparent element 150A of cover 440C above region 124C. Connections 434 are preferably included in the material of cover 440C.

Figure 5A:
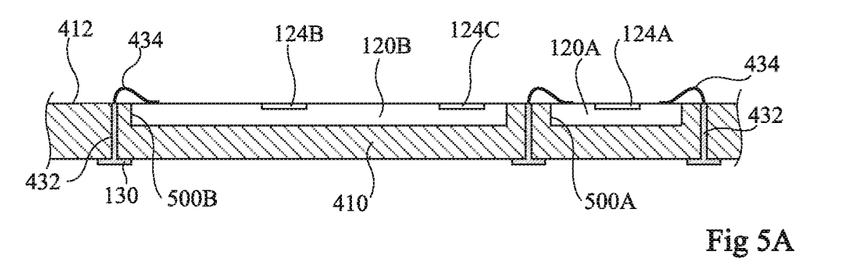
FIGS. 5A to 5C are simplified cross-section views illustrating steps of a method of manufacturing the device of FIG. 4A.
Figure 5B:
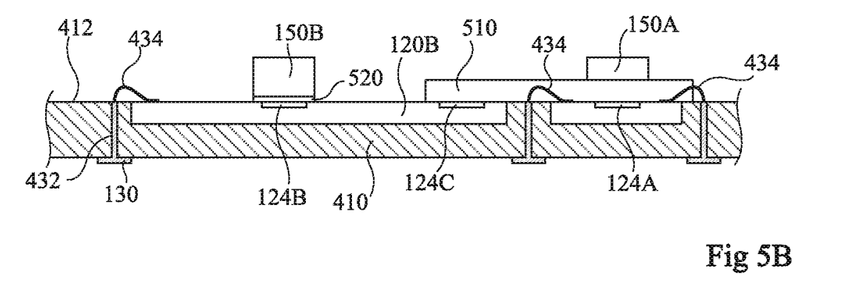
Figure 5C:
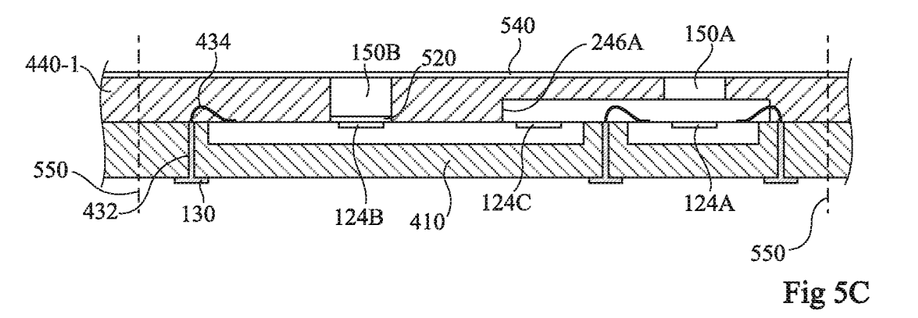

FIGS. 5A to 5C are simplified cross-section views illustrating steps of an example of a method of manufacturing the device of FIG. 4A, in the example of a device comprising two chips 120A and 120B.

As an example, a plurality of devices arranged in an array are simultaneously manufactured.

At the step of FIG. 5A, a layer comprising a plurality of substrates 410 arranged in an array is provided. A single substrate 410 is shown in FIGS. 5A to 5C. Substrate 410 comprises, on the side of its upper surface 412, a housing 500A for chip 120A. The depth of housing 500A corresponds to the thickness of chip 120A. Substrate 410 comprises, on the side of its upper surface 412, a housing 500B for chip 120B. The depth of housing 500B corresponds to the thickness of chip 120B. The substrate further comprises metallizations 130 and connections 432.

Chips 120A and 120B are then arranged in their respective housings 500A and 500B. The chips are flush with upper surface 412 of substrate 410. Connections 434 are formed, each connection 434 coupling the top of a connection 432 to the upper surface of one of the chips.

At the step of FIG. 5B, a portion of layer 510 of transparent material is formed at the location of the future cavity 246A. The portion of layer 510 covers both region 124A and region 124C. The portion of layer 510 may partially or totally cover some of connections 434. Elements 150A and 150B are then arranged on respective regions 124A and 124B. As an example, element 150B may be bonded by means of a transparent glue 520 to region 124B.

At the step of FIG. 5C, a molding, preferably film assisted, is carried out similarly to that described in relation with FIG. 3G. Elements 150A and 150B are covered with a film 540. Film 540 bears against the upper surfaces of elements 150A and 150B. A layer 440-1 is then formed by molding, film 540 bearing against an inner wall of a mold.

The devices are then separated into individual devices by cutting along lines 550.

The above-described method is compatible with the examples of FIGS. 4B and 4C and is compatible with any number of chips, for example, optoelectronic.

Specific embodiments have been described. Various alterations, modifications, and improvements will readily occur to those skilled in the art.

Various embodiments with different variations have been described hereinabove. It should be noted that those skilled in the art may combine various elements of these various embodiments and variations without showing any inventive step.

Finally, the practical implementation of the described embodiments is within the abilities of those skilled in the art based on the functional indications given hereinabove.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
 a substrate including a top surface;
 a first optoelectronic chip positioned in the substrate and having a top surface flush with the top surface of the substrate;
 a second optoelectronic chip positioned in the substrate and having a top surface flush with the top surface of the substrate; and
 a cover covering the substrate, the first optoelectronic chip, and the second optoelectronic chip, the cover including a first cavity that extends continuously over a first optical transduction region of the first optoelectronic chip and over a second optical transduction region of the second optoelectronic chip.

2. The device of claim 1, wherein the cover has a planar surface mechanically coupled to the top surface of the substrate.

3. The device of claim 1, wherein the cover comprises an electric connection in contact with the first optoelectronic chip.

4. The device of claim 1, wherein the first cavity is filled with a transparent material.

5. The device of claim 1, wherein the cover comprises a transparent element above the first optical transduction region.

6. The device of claim 5, wherein the transparent element is continued above the second optical transduction region.

7. The device of claim 5, further comprising a shield partially covering the transparent element above the second optical transduction region.

8. The device of claim 1, further comprising a transparent element in the cover, the transparent element overlying a third optical transduction region of the second optoelectronic chip.

9. The device of claim 1, wherein the cover includes a second cavity extending over at least a portion of the second optoelectronic chip.

10. The device of claim 9, wherein a portion of the cover located between the first cavity and the second cavity contacts the second optoelectronic chip between the second optical transduction region and a third optical transduction region of the second optoelectronic chip.

11. The device of claim 10, further comprising a transparent element in the cover, the transparent element overlying the second cavity and aligned with the third optical transduction region.

12. A device comprising:
a substrate;
a first optoelectronic chip positioned in the substrate and having a first optical transduction region;
a second optoelectronic chip positioned in the substrate and having a second optical transduction region; and
a cover covering the substrate and the first and second optoelectronic chips, wherein the cover includes a cavity that extends continuously over the first and second optical transduction regions.

13. The device of claim 12, wherein the cover comprises an electric connection in contact with the chip.

14. The device of claim 12, further comprising a transparent element that fills the cavity.

15. The device of claim 12, further comprising a shield partially covering the transparent element above the second transduction region.

16. The device of claim 12, further comprising a transparent element in the cover, the transparent element overlying the cavity and aligned with the first optical transduction region of the first optoelectronic chip.

17. A device comprising:
a substrate including a top surface;
an optical transmitter positioned in the substrate and having a top surface flush with the top surface of the substrate;
a first optical receiver positioned in the substrate and having a top surface flush with the top surface of the substrate; and
a cover covering the substrate and including a cavity overlying the optical transmitter and the first optical receiver, the cavity extending continuously from a first position overlying a portion of the optical transmitter to a second position overlying a portion of the first optical receiver.

18. The device of claim 17, wherein a portion of the cover extends over a first portion of the cavity and overlies the first optical receiver, and the cover includes an opening that overlies a second portion of the cavity and overlies the optical transmitter, the device further comprising a transparent element that fills the opening and overlies the second portion of the cavity and the optical transmitter.

19. The device of claim 17, further comprising:
a transparent element that fills the cavity; and
a shield partially covering the transparent element above the first optical receiver.

20. The device of claim 17, further comprising:
a first optoelectronic chip positioned in the substrate and including the first optical receiver and a second optical receiver;
a second optoelectronic chip positioned in the substrate and including the optical transmitter;
a first transparent element positioned in a first opening of the cover and overlying the second optical receiver; and
a second transparent element positioned in a second opening of the cover and overlying the optical transmitter.

* * * * *